United States Patent [19]

Hartemann

[11] 4,023,120
[45] May 10, 1977

[54] SURFACE WAVE PROGRAMMABLE OSCILLATOR

[75] Inventor: Pierre Hartemann, Paris, France

[73] Assignee: Thomson-CSF, Paris, France

[22] Filed: Feb. 27, 1976

[21] Appl. No.: 662,258

[30] Foreign Application Priority Data

Apr. 2, 1975  France .............................. 75.10228

[52] U.S. Cl. .......................... 331/107 A; 333/30 R; 333/72

[51] Int. Cl.² ..................... H03H 9/26; H03H 9/32; H03B 5/32

[58] Field of Search ........................ 333/30 R, 72; 331/107 A, 154, 179; 310/8.1, 8.2, 9.8

[56] References Cited

UNITED STATES PATENTS

| | | | |
|---|---|---|---|
| 3,533,019 | 10/1970 | Knirsch | 333/7 D |
| 3,745,564 | 7/1973 | Gandolfo et al. | 310/8.1 X |
| 3,805,189 | 4/1974 | Zucker et al. | 331/107 A |
| 3,831,116 | 8/1974 | Davis, Jr. et al. | 331/107 A |
| 3,950,713 | 4/1976 | Lewis | 333/30 R |
| 3,962,652 | 6/1976 | Zarin et al. | 333/72 X |

FOREIGN PATENTS OR APPLICATIONS

2,418,958  11/1974  Germany .......................... 333/72

*Primary Examiner*—Paul L. Gensler
*Assistant Examiner*—Marvin Nussbaum
*Attorney, Agent, or Firm*—Cushman, Darby & Cushman

[57] ABSTRACT

The present invention relates to surface elastic wave programmable oscillators. The oscillator in accordance with the invention comprises an amplifier and a feedback loop comprising a selective surface wave transmission system which offers N possibilities of energy exchange between a transducer array with curved teeth, and a set of auxiliary transducers arranged in a fantail fashion.

4 Claims, 2 Drawing Figures

SURFACE WAVE PROGRAMMABLE OSCILLATOR

The present invention relates to programmable oscillators wherein the frequency determining network comprises a surface elastic wave device.

A programmable oscillator makes it possible to provide alternating signals whose frequencies can acquire several discrete values, any one of these values being selected under the control of an electrical signal acting upon appropriate switching means. Oscillators utilizing the surface elastic wave principle have the advantage of requiring no winding in order to determine the oscillatory frequency.

In a patent No. 3,919,669 filed Apr. 17, 1974 in the name of Hartemann and assigned to the asignee of the present patent application. A frequency selective transmission system has been described which is essentially constituted by a substrate at the surface of which surface elastic waves can propagate. A transducer array comprising interdigital comb structures with curved teeth, is arranged on the surface of the substrate whilst at the same time, a set of auxiliary surface elastic wave transducers in a fantail arrangement, is also provided. This configuration makes it possible to exchange between the transducer array having the curved teeth and the auxiliary transducers, vibrational energy in accordance with a direction of exchange which depends upon the frequency. This frequency-selective transmisson system is particularly well suited as a means of designing the selective feedback loop of an oscillatory circuit comprising an amplifier.

Switching circuits connected to the auxiliary transducers of the transmission system make it possible to readily select one of the oscillatory frequencies by a discrete modification in the operating conditions of the feedback loop.

In accordance with the present invention there is provided a programmable oscillator utilizing the surface elastic wave principle, which comprises a frequency-selective transmission system forming a feedback loop connected to amplifier means having a pair of input terminals and a pair of output terminals. One of said pairs of terminals is connected to a transducer array with curved teeth, belonging to said selective transmission system. The other of said pairs of terminals is selectively connected by switching means to any one of the N auxiliary transducers of said selective transmission systems. The fantail design of said N auxiliary transducers is such that exchanges of vibrational energy between said transducer array and said auxiliary transducers give rise to a positive, unitary loop gain for N separate frequencies of oscillation.

For a better understanding of the present invention and to show how the same may be carried into effect, reference will be made to the attached figures among which:

Figure 1:
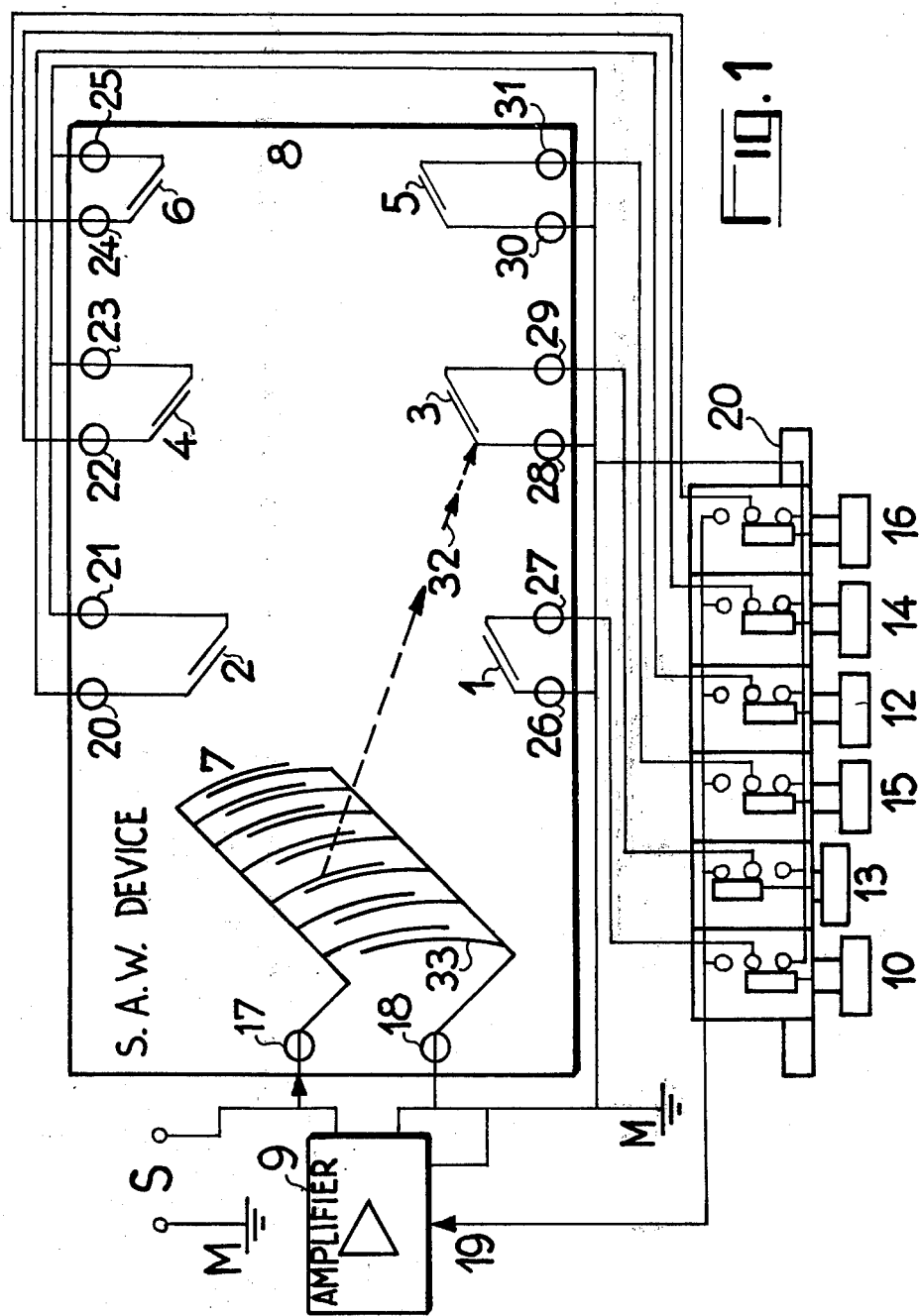
FIG. 1 illustrates a programmable oscillator in accordance with the invention.

In FIG. 1, a transducer array can be seen constituted by electrodes 7 in the form of interdigital comb structures, which have been deposited upon a substrate 8. The transducer array comprises curved emissive gaps 33 the phase centers of which form an array of pseudo-punctiform radiating sources emitting a directional beam of surface acoustic waves when an alterating voltage of frequency $f$ is applied between the terminals 17 and 18.

The direction of the radiated beam is a function of the pitch of the radiating sources and of the excitation frequency. In the parent case, it has been shown that by arranging a set of auxiliary transducers 1, 2, 3, 4, 5 and 6 in a fantail disposition, it is possible to establish between the transducer array 7, and each of auxiliary transducers, interchanges of vibrational energy which occur within adjacent frequency ranges. It is this property which is exploited in order to form a programmable oscillator. Terminals 21, 23, 25, 26, 28 and 30 of the auxiliary transducers are connected to an earthing point M to which the earth of the amplifier 9, the electrode 18 of the transducer array 7 and the bottom row of contacts of a group of reversing switches forming part of a key-operated switching arrangement 20, are also connected. The interlock mechanism associated with the keys 10, 13, 15, 12, 14 and 16 is such that the depression of one key causes the others to return. In FIG. 1, the key 13 has been shown depressed and it can be seen that the transducers 1, 2, 4, 5 and 6 are short-circuited. Only the transducer 3 is connected to the input 19 of the amplifier 9. The output of the amplifier 9 supplies the output terminals S of the programmable oscillator and also the terminals 17 and 18 of the transducer array 7. Thus, we are dealing with a feedback loop which is closed through the agency of an exchange of vibrational energy 32 between the transducer 3 and the transducer array 7. The arrangement of the transducer 3 is shown in such a manner that the loop gain G is around +1, so that the overall system oscillates at a frequency which depends upon the choice of the auxiliary transducer. The deppression of another key brings another auxiliary transducer into operation and the oscillatory frequency acquires a different discrete value.

It is also possible to exchange the input and the output of the amplifier with the result that surface elastic waves are emitted by an auxiliary transducer selected by the switch 20.

Figure 2:
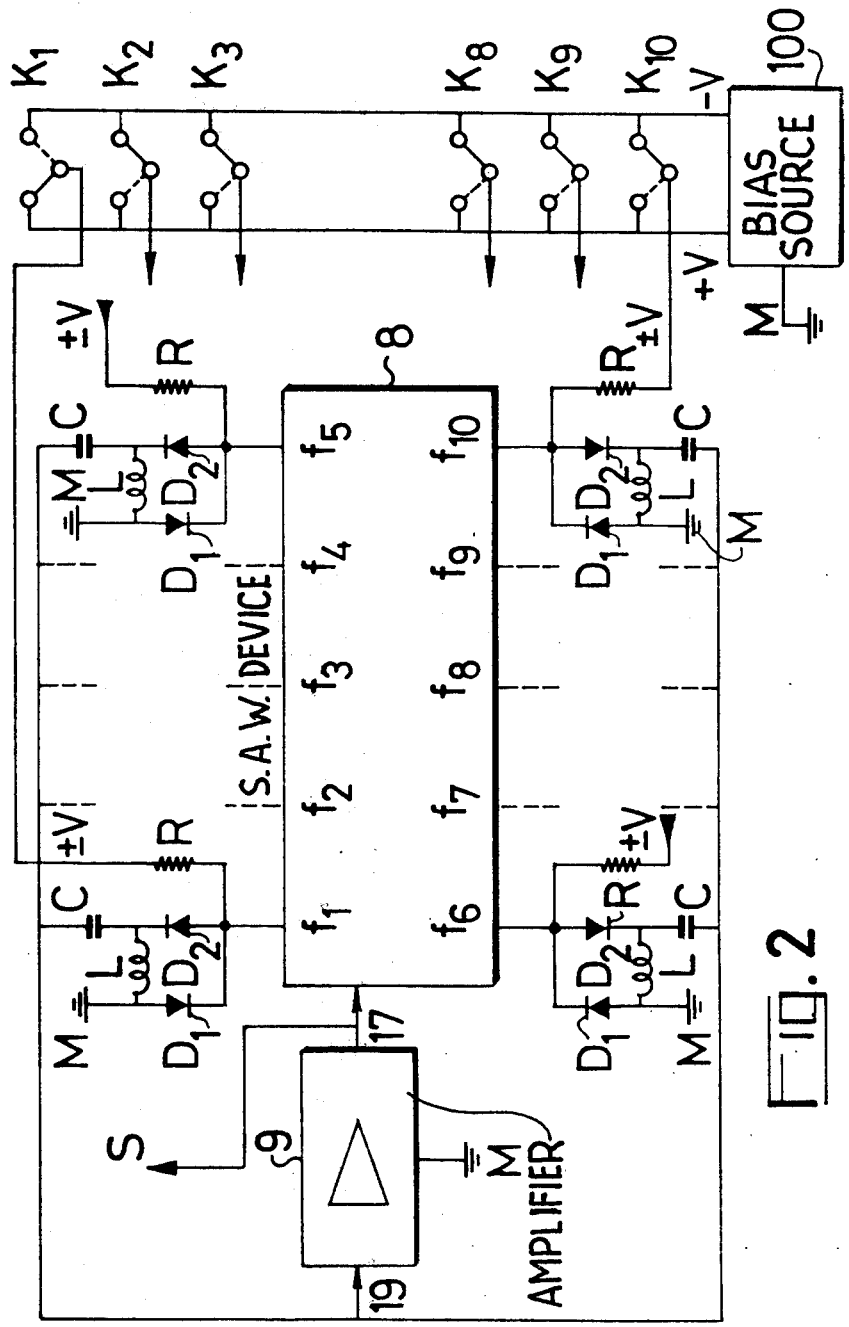
FIG. 2 illustrates a variant embodiment of the programmable oscillator in accordance with the invention.

In FIG. 2, a variant embodiment of the programmable oscillator can be seen, which makes it possible to operate it by remote-control due to the presence of diode switches assembled in proximity of the transmission system 8. A single lead 17 has been used to symbolise the terminals of the transducer array possessing the curved teeth. The terminals of the auxiliary transducers are symbolised by a single lead, the reference for which is the frequency $f_1, f_2, f_3, f_4, f_5, f_6, f_7, f_8, f_9$, or $f_{10}$ at which the programmable oscillator is to oscillate.

The diode switch corresponding to anyone of these channels, comprises a diode $D_2$ connected in series with a capacitor C.

The capacitor C is connected to the input 19 of the amplifier 9. A choke L connects the cathode of the diode $D_2$ to earth so that it can be forward-biased by a voltage +V applied across a resistor R. When the anode of the diode $D_2$ receives the voltage +V which is at least equal to the conduction threshold, it has a very low differential resistance, so that the oscillatory loop closes. When the diode $D_2$ receives a voltage −V, it blocks, so that the loop is open-circuited. To improve the open-circuiting of the loop, a diode $D_1$ can be connected between earth M and the auxiliary transducer terminal which is ot earthed. The diode $D_1$ conducts when $D_2$ is blocked and vice-versa.

The control means required in order to select one of the ten possible oscillatory loops, consist of a bias source 100 supplying the voltages +V and −V to stack of switches $K_1$, $K_2$, $K_3$, $K_4$, $K_5$, $K_6$, $K_7$, $K_8$, $K_9$ and $K_{10}$. A single one of the 10 switches $K_1$ to $K_{10}$ connects the resistor R of one of the diode switches, to the terminal +V of the bias source. In FIG. 2, it can be seen how the oscillation has the frequency $f_1$, since the switch $K_1$, having a same index, is in the position which makes $D_2$ conductive and blocks $D_1$. Self-evidently, the invention is not limited to the two examples shown in FIGS. 1 and 2. In particular, it is conceivable that two or more transducer arrays 7 could be provided on one and the same substrate 8, with one or more amplifiers 9 in order to define one or more oscillatory loops operating together or separately. Switching means having two stable states could equally well be provided in order to reduce the power consumption of the bias source responsible for the remote-control function. Operation as a programmable selective filter is conceivable if the loop gain is reduced to just within the value which results in the attainment of a condition of sustained oscillation.

What I claim is:

1. A surface wave programmable oscillator comprising: a frequency selective transmission system, ampifier means having respective input and output terminals, and N positions switching means; said frequency selective transmission system comprising a piezoelectric substrate, an electromechanical transducer array for launching along the surface of said substrate a beam of ultrasonic energy, and a set of N auxiliary surface wave transducers arranged on said surface in fantail fashion for successively collecting said beam of ultrasonic energy; one of said terminals being connected to said electromechanical transducer array, and the other of said terminals being connected through the agency of said N positions switching means respectively to said N auxiliary surface wave transducers; said electromechanical transducer array comprising electrode means in the form of interidigitated comb shaped structures with curvilinear teeth.

2. An oscillator as claimed in claim 1, wherein said N positions switching means comprise N switching circuits respectively connected to said N auxiliary surface wave transducers and a biasing circuit; each said switching circuits comprising at least one diode; said diode being driven into conduction by said biasing circuit for causing said oscillator to oscillate at anyone of N distinct frequencies.

3. An oscillator as claimed in claim 2, wherein each said N switching circuits comprises a further diode connected across the corresponding one of said N auxiliary surface wave transducers; said further diode being driven into conduction by said biasing circuit each time said at least one diode is in its non-conducting state, for preventing said oscillator from oscillating at more than one of said N distinct frequencies.

4. An oscillator as claimed in claim 3, wherein said diodes are semiconductor devices.

* * * * *